US009515148B2

(12) United States Patent
Li et al.

(10) Patent No.: US 9,515,148 B2
(45) Date of Patent: Dec. 6, 2016

(54) BRIDGING LOCAL SEMICONDUCTOR INTERCONNECTS

(71) Applicants: INTERNATIONAL BUSINESS MACHINES CORPORATION, Armonk, NY (US); STMicroelectronics, Coppell, TX (US)

(72) Inventors: Wai-Kin Li, Beacon, NY (US); Chieh-Yu Lin, Hopewell Junction, NY (US); Yannick Daurelle, Crolles (FR)

(73) Assignees: International Business Machines Corporation, Armonk, NY (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/076,871

(22) Filed: Nov. 11, 2013

(65) Prior Publication Data

US 2015/0129961 A1    May 14, 2015

(51) Int. Cl.
*H01L 29/40* (2006.01)
*H01L 21/441* (2006.01)
*H01L 21/762* (2006.01)
*H01L 21/8234* (2006.01)
*H01L 27/088* (2006.01)
*H01L 21/768* (2006.01)

(52) U.S. Cl.
CPC ............ *H01L 29/40* (2013.01); *H01L 21/441* (2013.01); *H01L 21/7624* (2013.01); *H01L 21/76807* (2013.01); *H01L 21/76841* (2013.01); *H01L 21/76895* (2013.01); *H01L 21/823425* (2013.01); *H01L 21/823475* (2013.01); *H01L 27/088* (2013.01)

(58) Field of Classification Search
CPC .................... H01L 21/76895; H01L 21/76841; H01L 27/088; H01L 21/823425; H01L 21/823475

USPC .................. 257/347, 212, 213, 377, E21.59,257/E27.112, E21.32, E21.545, E21.5, 61, 758,257/365
See application file for complete search history.

(56) References Cited

U.S. PATENT DOCUMENTS

| | | | |
|---|---|---|---|
| 5,585,302 | A | 12/1996 | Li |
| 6,271,063 | B1 | 8/2001 | Chan et al. |
| 6,765,269 | B2 | 7/2004 | Lee et al. |
| 7,737,482 | B2 | 6/2010 | Cheng et al. |
| 7,851,283 | B2 | 12/2010 | Anderson et al. |
| 8,188,550 | B2 | 5/2012 | Yang et al. |
| 8,466,501 | B2 | 6/2013 | Hershberger et al. |
| 2002/0153612 | A1* | 10/2002 | Akram et al. ................. 257/758 |

(Continued)

OTHER PUBLICATIONS

"Upon." Merriam-Webster.com. 2015. http://www.merriam-webster.com (Jul. 24, 2015).*

(Continued)

*Primary Examiner* — Mohammad Islam
*Assistant Examiner* — Mikka Liu
(74) *Attorney, Agent, or Firm* — Matthew C. Zehrer

(57) ABSTRACT

A semiconductor device includes a plurality of gates formed upon a semiconductor substrate that includes a plurality of outer active areas (e.g. CMOS/PMOS areas, source/drain regions, etc.) and one or more inner active areas. An isolator is formed upon one or more inner gates associated with the one or more inner active areas. A contact bar electrically connects the outer active areas and/or outer gates and is formed upon the isolator. The isolator electrically insulates the contact bar from the one or more inner active areas and/or the one or more inner gates.

15 Claims, 7 Drawing Sheets

(56) References Cited

U.S. PATENT DOCUMENTS

| | | | |
|---|---|---|---|
| 2008/0211023 A1* | 9/2008 | Shino | H01L 27/108 257/347 |
| 2008/0237714 A1* | 10/2008 | Fazan | H01L 21/84 257/347 |
| 2013/0214289 A1* | 8/2013 | Mehrotra | H01L 29/66545 257/77 |

OTHER PUBLICATIONS

"On." Merriam-Webster.com. 2015. http://www.merriam-webster.com (Jul. 24, 2015).*

* cited by examiner

BRIDGING LOCAL SEMICONDUCTOR INTERCONNECTS

FIELD

Embodiments of invention generally relate to semiconductor device, and more particularly to structures, semiconductor devices, and fabrication of semiconductor devices with bridged local interconnects.

DESCRIPTION OF THE RELATED ART

In semiconductor device fabrication, various semiconductor components should be electrically connected to other semiconductor components. Depending upon layout of semiconductor components within the semiconductor device it may be challenging to electrically connect the desired components, especially if the components to be connected are located near each other or if other semiconductor components separate the components to be connected.

SUMMARY

Embodiments of invention generally relate to semiconductor devices, and more particularly structures, semiconductor devices, and fabrication of a semiconductor device with bridged local interconnects.

In a first embodiment, a semiconductor device includes a plurality of gates formed upon a semiconductor substrate, where the semiconductor substrate comprising a plurality of outer active areas and one or more inner active areas, an isolator formed upon one or more inner gates associated with the one or more inner active areas, and a contact bar electrically connecting the outer active areas, the contact bar formed upon the isolator that insulates the contact bar from the one or more inner gates.

In another embodiment, a semiconductor device includes a plurality of gates formed upon a semiconductor substrate, the semiconductor substrate comprising a plurality of outer gates and one or more inner gates, an isolator formed upon one or more inner gates, and a contact bar electrically connecting the plurality of gates.

In another embodiment, a semiconductor device fabrication method includes: forming a plurality of transistor gates comprising one or more inner gates and one or more outer gates upon a semiconductor substrate; forming an isolator upon one or more inner gates that electrically insulates the contact bar from the one or more inner gates; forming a protective barrier portion upon the isolator, and; forming a contact bar electrically connecting the plurality of outer active areas upon the protective barrier portion.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1:
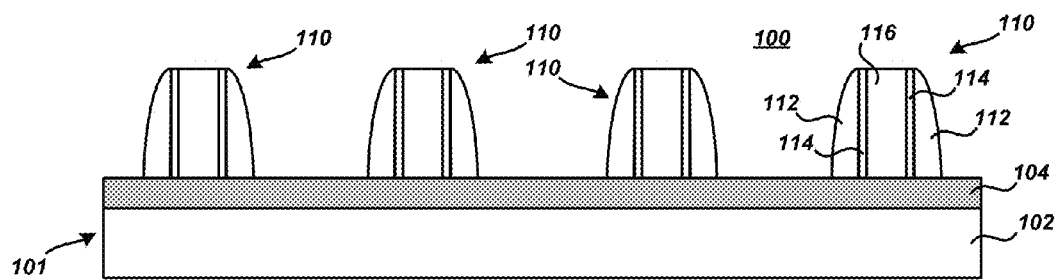
FIG. 1-FIG. 8 depict cross section views of semiconductor structures at intermediate stages of semiconductor device fabrication, in accordance with various embodiments of the present invention.

Detailed embodiments of the claimed structures and methods are disclosed herein; however, it can be understood that the disclosed embodiments are merely illustrative of the claimed devices, structures, and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the invention may relate to the fabrication of finFET devices. A finFET device may include a plurality of fins formed in a wafer, a gate covering a portion of the fins, wherein the portion of the fins covered by the gate serves as a channel region of the device and portions of the fins extending out from under the gate serve as source and drain regions of the device, and spacers on opposite sides of the gate. Embodiments of the present invention may be implemented in a gate first or a gate last finFET fabrication process flow.

In a gate first process flow, metal layers over a first active area and second active area are formed and patterned to form gate structures followed by typical CMOS processing such as forming of the source and drain, forming spacers and depositing of interlevel dielectric. In a gate last process flow, a semiconductor substrate may be patterned and etched to form fins (not shown). Next, a dummy gate may be formed in a direction perpendicular to the length of the fins. For example, the dummy gate may be patterned and etched from a blanket layer of polysilicon. A pair of spacers can be disposed on opposite sidewalls of the dummy gate. Later, the dummy gate may be removed from between the pair of spacers, as by, for example, an anisotropic vertical etch process such as a reactive ion etch (RIE). This creates an opening between the spacers where a metal gate may then be formed.

Typical integrated circuits (e.g. semiconductor devices, semiconductor structures, etc.) may be divided into a plurality of active areas and a plurality of non-active areas. The active areas may include finFET devices (e.g. pFET, nFET, etc.). Each active area may have a different pattern density, different number of finFET devices, different type of finFET device(s), etc.

Referring now to the FIGS, exemplary process steps of forming a semiconductor structure 100 in accordance with embodiments of the present invention are shown, and will now be described in greater detail below. It should be noted that the particular cross section view and/or the particular top view of the FIGS were depicted for illustrative purposes only. Furthermore, it should be noted that while this description may refer to some components of the structure 100 in the singular tense, more than one component may be depicted throughout the figures and like components are labeled with like numerals.

Referring now to FIG. 1, a cross section view of the structure 100 is shown at an intermediate step during a semiconductor device fabrication process flow. At this step of fabrication, the structure 100 may generally include a plurality of gate stacks 110 formed upon a substrate 101.

The semiconductor substrate 101 may include a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. An SOI substrate may include a base substrate 102, a buried dielectric layer 104 formed on top of the base substrate 102, and a SOI layer (not shown) formed on top of the buried dielectric layer 104. The buried dielectric layer 104 may isolate the SOI layer from the base substrate 102. It should be noted that a plurality of fins (not shown) may be etched from the uppermost layer of the SOI substrate, the SOI layer.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may have a thickness ranging from 0.5 mm to about 1.5 mm.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material. Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm. In one embodiment, the buried dielectric layer 104 may have a thickness ranging from about 150 nm to about 180 nm.

The SOI layer may include any of the several semiconductor materials included in the base substrate 102. In general, the base substrate 102 and the SOI layer may include either identical or different semiconducting materials with respect to chemical composition, dopant concentration and crystallographic orientation. In one particular embodiment of the present invention, the base substrate 102 and the SOI layer include semiconducting materials that include at least different crystallographic orientations. Typically the base substrate 102 or the SOI layer include a {110} crystallographic orientation and the other of the base substrate 102 or the SOI layer includes a {100} crystallographic orientation. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins may be etched from the SOI layer. Because the plurality of fins may be etched from the SOI layer, they too may include any of the characteristics listed above for the SOI layer.

When a bulk substrate is utilized, the base substrate 102 may be etched to form fins. Dielectric portions may then be formed between fins and may include any of several dielectric materials, for example, oxides, nitrides and oxynitrides of silicon. The dielectric portions may also include oxides, nitrides and oxynitrides of elements other than silicon. In addition, the dielectric portions may include crystalline or non-crystalline dielectric material. Moreover, the dielectric portions may be formed using any of several known methods, for example, thermal or plasma oxidation or nitridation methods, chemical vapor deposition methods, and physical vapor deposition methods. The dielectric portions may have a thickness ranging from about 5 nm to about 200 nm. In one embodiment, the dielectric portions may have a thickness ranging from about 150 nm to about 180 nm. In certain embodiments, dielectric portions may be etched or recessed following their formation.

Gate stack 110 may be formed upon semiconductor substrate 101. In certain embodiments, gate stack 110 may include a gate dielectric layer (not shown) formed atop semiconductor substrate 101 utilizing a conventional deposition process including, for example, chemical vapor deposition, plasma enhanced chemical vapor deposition or chemical solution deposition. A layer of gate 116 material may be formed upon gate dielectric, and a gate cap (not shown) may be formed upon gate 116. In certain embodiments, spacers 114, 112 may be formed on the sides of gate 116. Generally, gate stack 110 may be formed by other known processes without deviating from the spirit of those embodiments herein claimed.

Figure 2:
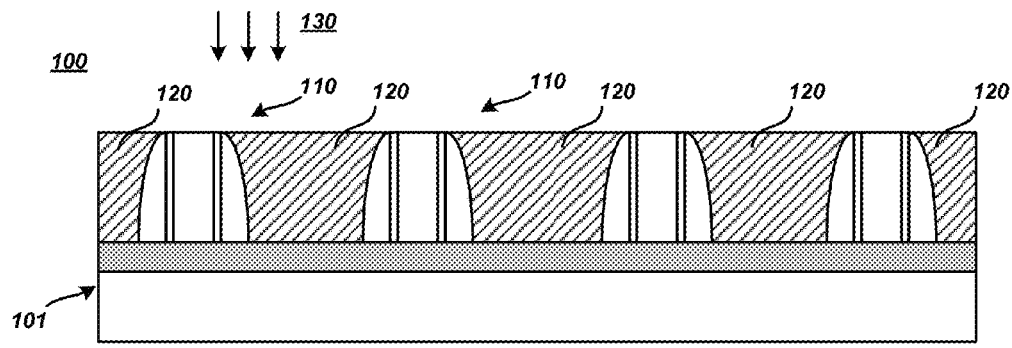

Referring now to FIG. 2, a cross section view of the structure 100 is shown at an intermediate step during a semiconductor device fabrication process flow. At this step of fabrication, the structure 100 may generally include an oxide layer 120.

The oxide layer 120 may include a silicon oxide or a silicon oxynitride. In one embodiment, the oxide layer 120 can be formed, for example, by thermal or plasma conversion of a top surface of the SOI layer into a dielectric material such as silicon oxide or silicon oxynitride. In one embodiment, the oxide layer 120 can be formed by the deposition of silicon oxide or silicon oxynitride by chemical vapor deposition (CVD) or atomic layer deposition (ALD).

In certain embodiments, oxide layer 120 is deposited or otherwise formed such that a top surface of the oxide layer 120 is coplanar with a top surface of one or more gate stacks 110. In other embodiments, oxide layer 120 is deposited or otherwise formed such that the top surface of the oxide layer 120 is above the top surface of one or more gate stacks 110. The oxide layer 120 may be planarized to the top surface of one or more gate stacks 110 using a chemical mechanical polishing (CMP) technique 130. The CMP technique 130 may remove some of the oxide layer 120. In one embodiment, the CMP technique 130 may use a ceria based slurry to recess the oxide layer 120. The CMP technique 130 may be designed to improve planarity of the upper surface of oxide layer 120 and one or more top surfaces of gate stack 110 and may advantageously eliminate the non-planer surfaces of structure 100 caused by variations in pattern density. Generally, oxide layer 120 may be formed with other known or additional techniques than those described without deviating from the spirit of those embodiments herein claimed.

Figure 3:
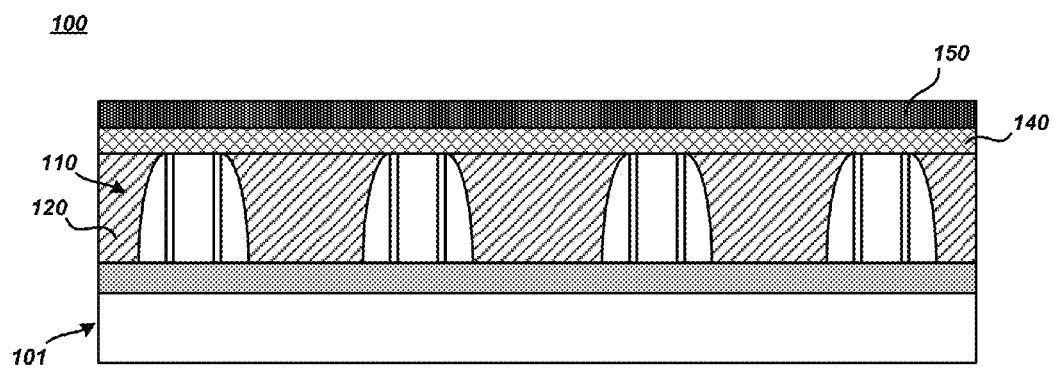

Referring now to FIG. 3, a cross section view of the structure 100 is shown at an intermediate step during a semiconductor device fabrication process flow. At this step of fabrication, the structure 100 may generally include an multi-layer isolator including a dielectric layer 140 and a barrier layer 150 formed thereupon.

The dielectric layer 140 may include silicon oxide, a silicon nitride, CVD low-k dielectric material, and a spin-on low-k dielectric material, etc. In some embodiments, the dielectric layer 140 can be formed by the deposition of silicon oxynitride by CVD, ALD, etc. and may have a thickness of, for example, 10 nm to 50 nm. Barrier layer 150 may be an intermediate, barrier, or conducting film such as tungsten silicide, generally in the form of ($WSi_2$), or other such similar material. In some embodiments, the barrier layer 150 may be formed by tungsten silicide CVD and/or ALD deposition, etc. and may have a thickness of, for example, 1 nm to 100 nm. Generally, dielectric layer 140 and/or barrier layer 150 may be formed with other known or additional techniques than those described without deviating from the spirit of those embodiments herein claimed.

Figure 4:
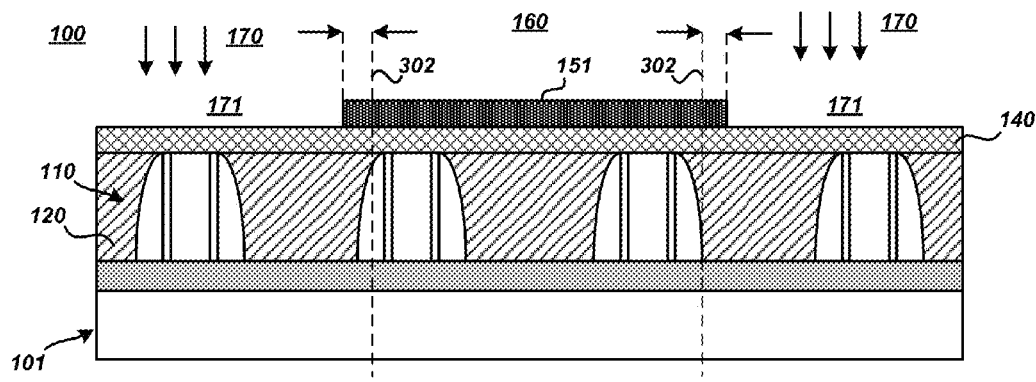

Referring now to FIG. 4, a cross section view of the structure 100 is shown at an intermediate step during a semiconductor device fabrication process flow. At this step of fabrication, the structure 100 may generally include an multi-layer isolator including the dielectric layer 140 and barrier layer 150 with selective portions 171 removed.

At this stage of fabrication, mask 160 may be deposited upon the structure 100 and be used to form barrier layer 150 with selective portions 171 removed. Mask 160 may be an oxide or nitride material and could be a bilayer of oxide and nitride (i.e., oxide deposited first and then nitride on top, or vice versa) and can be deposited over the semiconductor structure 100 using, e.g., a CVD process, etc. Selective portions of mask 160 may be removed by generally known techniques to expose portions 171 of barrier layer 150. An etch process 170, such as reactive ion etching, may be used to remove the portions 171 of barrier layer 150 in the regions not covered by mask 160. The etch process 171 may be timed so that portions 171 of barrier layer 150 is removed selective to the upper surface of dielectric layer 140, while maintained under mask 160. The portion of barrier layer 150 that remains subsequent to the etch process 170 is herein referred to as barrier layer 151. Mask 160 may be removed from semiconductor structure 100 by known techniques. In certain embodiments, the width of barrier layer 151 is determined by the underlying gate stacks 110. For example it may be advantageous for the barrier layer 151 to extend past a plane 302 that may bisect an outer location of a gate stack 110. Generally, barrier layer 151 may be formed with other known or additional techniques than those described without deviating from the spirit of those embodiments herein claimed.

Figure 5:
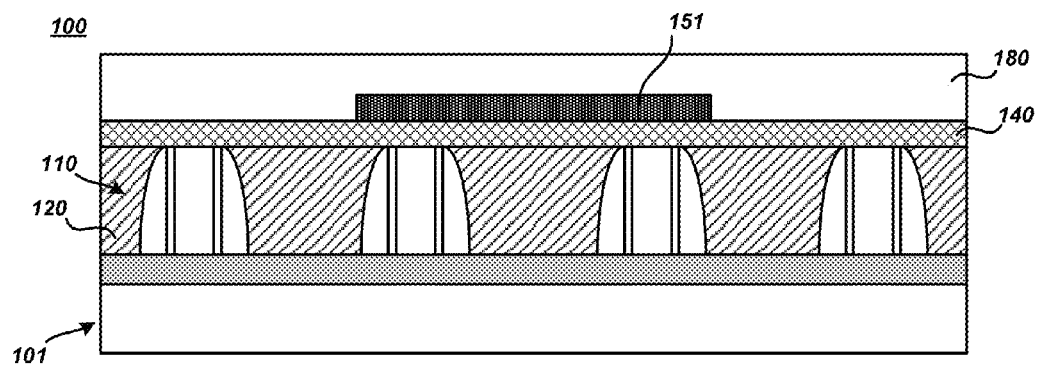

Referring now to FIG. 5, a cross section view of the structure 100 is shown at an intermediate step during a semiconductor device fabrication process flow. At this step of fabrication, the structure 100 may generally include an interlayer dielectric 180.

The interlayer dielectric 180 may include a silicon oxide or a silicon oxynitride. In one embodiment, the interlayer dielectric 180 can be formed, for example, by thermal or plasma conversion of a top surface of the dielectric layer 140 into a dielectric material such as silicon oxide or silicon oxynitride. In one embodiment, the interlayer dielectric 180 can be formed by the deposition of silicon oxide or silicon oxynitride by CVD, ALD, etc. In certain embodiments, the interlayer dielectric 180 is a blanket deposition generally upon barrier layer 151 and the exposed portions of dielectric layer 140. Generally, interlayer dielectric 180 may be formed with other known or additional techniques than those described without deviating from the spirit of those embodiments herein claimed.

Figure 6:
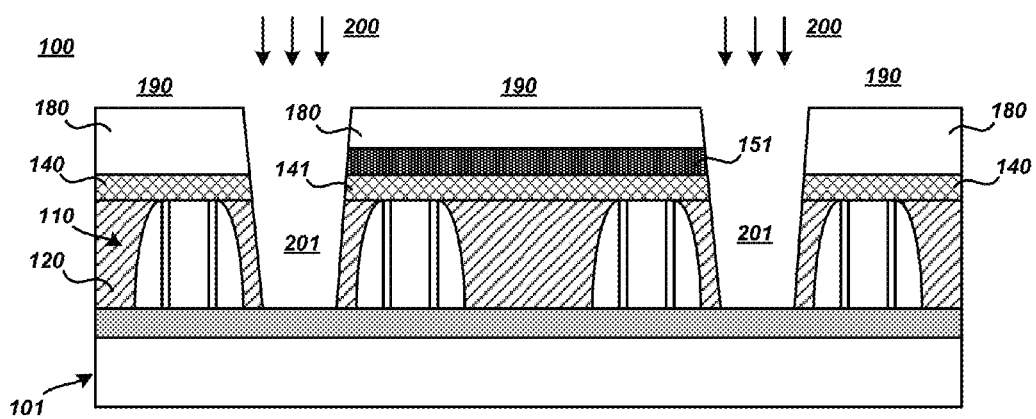

Referring now to FIG. 6, a cross section view of the structure 100 is shown at an intermediate step during a semiconductor device fabrication process flow. At this step of fabrication, the structure 100 may generally include a plurality of trenches 201.

At this stage of fabrication, mask 190 may be deposited upon the structure 100. Mask 190 may be an oxide or nitride material and could be a bilayer of oxide and nitride (i.e., oxide deposited first and then nitride on top, or vice versa) and can be deposited over the semiconductor structure 100 using, e.g., a CVD process, etc. In certain embodiments mask 190 is a hardmask. Selective portions of mask 190 may be removed by generally known techniques to expose portions of an upper surface of interlayer dielectric 180. An etch process 200, such as reactive ion etching, may be used to remove the portions of interlayer dielectric 180, portions of barrier layer 151, portions of dielectric layer 140, portions of oxide layer 120, et. in the regions not covered by mask 190. The etch process 200 may be timed so these portions are removed selective to substrate 101. The removed portions generally form one or more trenches 201. Mask 190 may be removed from semiconductor structure 100 by known techniques. In certain embodiments, trenches 201 are formed to support formation of middle of the line (MOL) contacts. In certain embodiments, a dielectric portion 141 and barrier layer 151 portion are formed between the plurality of trenches 201. Generally, trenches 201 may be formed with other known or additional techniques than those described without deviating from the spirit of those embodiments herein claimed.

Figure 7:
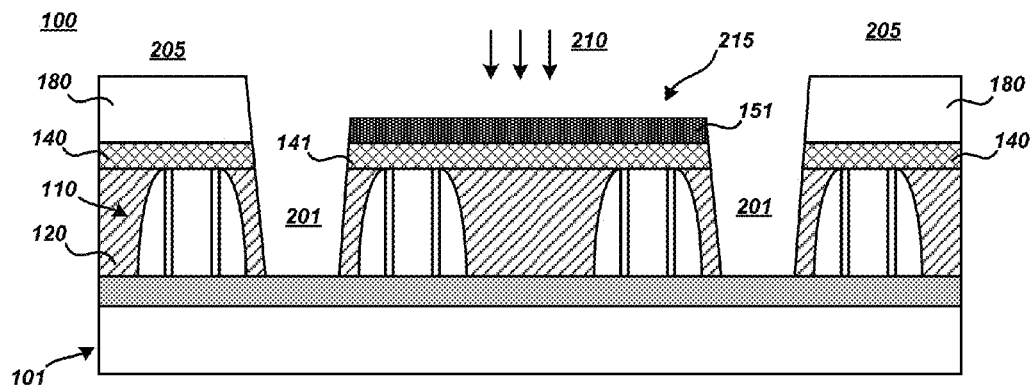

Referring now to FIG. 7, a cross section view of the structure 100 is shown at an intermediate step during a semiconductor device fabrication process flow. At this step of fabrication, the structure 100 may generally undergo an etch process 210.

At this stage of fabrication, mask 205 may be deposited upon the structure 100. Mask 205 may be an oxide or nitride material and could be a bilayer of oxide and nitride (i.e., oxide deposited first and then nitride on top, or vice versa) and can be deposited over the semiconductor structure 100 using, e.g., a CVD process, etc. Selective portions of mask 205 may be removed by generally known techniques to expose portions of an upper surface of interlayer dielectric

180. An etch process 210, such as reactive ion etching, may be used to remove the portions of interlayer dielectric 180 in the regions not covered by mask 205. The etch process 210 may be timed so these portions are removed selective to barrier layer 151. Mask 205 may be removed from semiconductor structure 100 by known techniques. In certain embodiments, an isolator 215 comprising barrier layer 151 and dielectric portion 141 is formed that may electrically isolate various portions of semiconductor structure 100 as is further described herein. Generally, portions of interlayer dielectric 180 may be removed with other known or additional techniques than those described without deviating from the spirit of those embodiments herein claimed.

Figure 8:
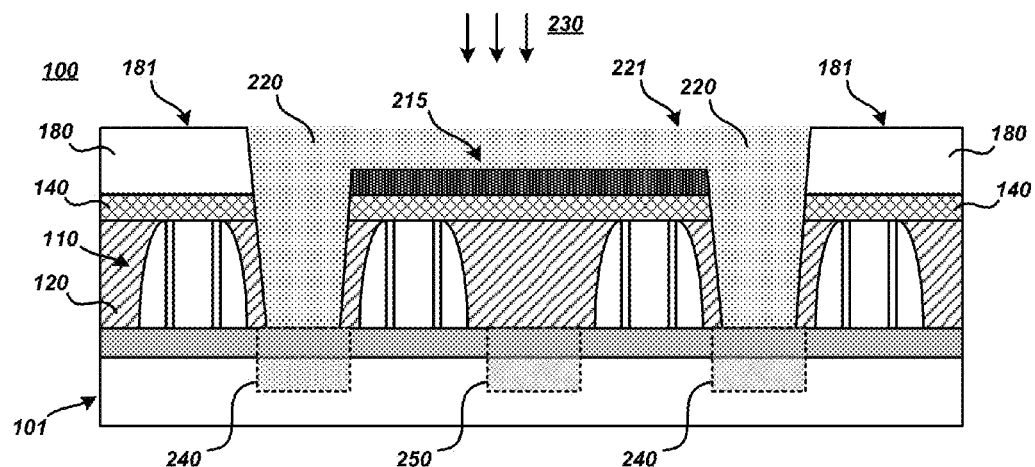

Referring now to FIG. 8, a cross section view of the structure 100 is shown at an intermediate step during a semiconductor device fabrication process flow. At this step of fabrication, the structure 100 may generally include contact bar 220.

Contact bar 220 may be created or formed by applying any suitable existing MOL and/or Back end of line (BEOL) processes and/or any future developed techniques, and may be made of materials such as tungsten (W), aluminum (Al), copper (Cu), or alloy thereof. Contact bar 220 is formed by depositing or otherwise forming conductive material within trenches 201 and upon barrier layer 151. In certain embodiments contact bar serves to electrically connect active areas of substrate 101. For example, contact bar 220 may contact and electrically connect active areas 240 of substrate 101 that are locationally separated by an active area 250 and/or one or more gate stacks 110. In certain embodiments, isolator 215 electrically separates an upper portion of the contact bar 220 from underlying gate stacks 110 and/or active area 250 of substrate 101.

Structure 100 may be planarized such that a top surface 221 of contact bar 220 and a top surface 181 of interlayer dielectric 180 are coplanar using a CMP technique 230. The CMP technique 230 may remove some contact bar 220 and interlayer dielectric 180. In one embodiment, the CMP technique 230 may use a ceria based slurry to recess the contact bar 220 and interlayer dielectric 180. The CMP technique 230 may be designed to improve planarity of the upper surface structure 100 and may advantageously eliminate the non-planer surfaces of structure 100 caused by variations in pattern density.

Though shown as a final fabrication stage in FIG. 8, semiconductor structure 100 may undergo further fabrication stages (e.g. BEOL fill, etc.) to produce a semiconductor device.

Figure 9:
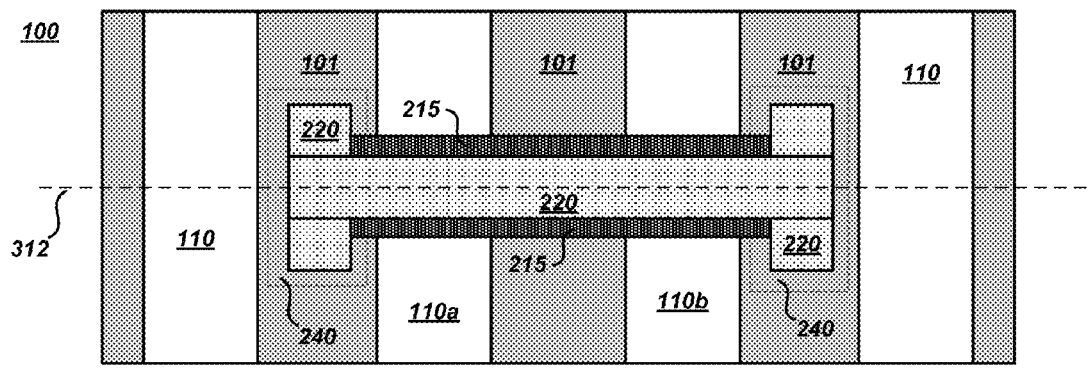
FIG. 9 and FIG. 10 depict top views of semiconductor structures at intermediate stages of semiconductor device fabrication, in accordance with various embodiments of the present invention.
Figure 10:
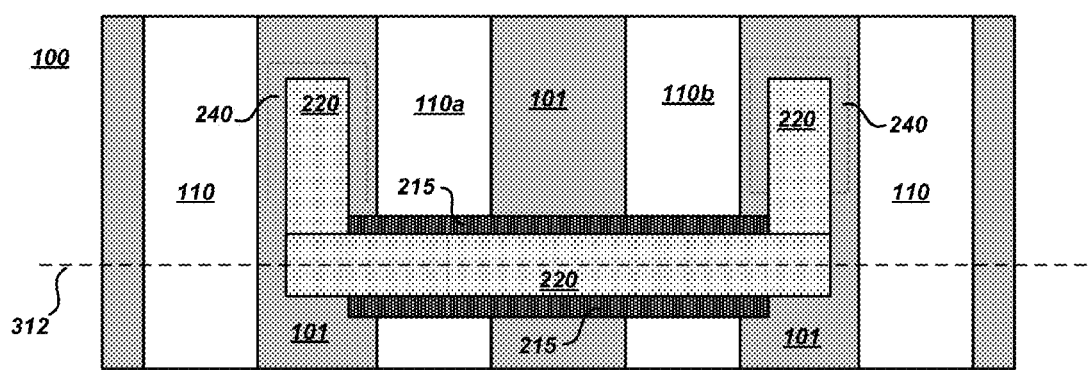

Referring now to FIG. 9 and FIG. 10 that depict top views of an exemplary semiconductor structure 100 at intermediate stages of semiconductor device fabrication, in accordance with various embodiments of the present invention. In certain embodiments, contact bar 220 contacts and electrically connect active areas 240 of substrate 101 that are locationally separated by gate stack 110*a* and gate stack 110*b*. In certain embodiments, isolator 215 electrically separates the contact bar 220 from gate stack 110*a* and gate stack 110*b*. Contact bar 220 may be arranged to be inline with active areas 240, as shown in FIG. 9. In other words, contact bar 220 and/or isolator 215 may be formed such that contact bar 220 and/or isolator 215 have a bisection plane 312 that intersects active areas 240. Alternatively, contact bar 220 may be arranged to be offset from active areas 240, as shown in FIG. 10. In other words, contact bar 220 and/or isolator 215 may be formed such that contact bar 220 and/or isolator 215 generally have a bisection plane 312 that does not intersect active areas 240. It is noted that oxide layer 120 has been removed from the top views of FIG. 9 and FIG. 10 in order to show the underlying details thereof.

Figure 11:
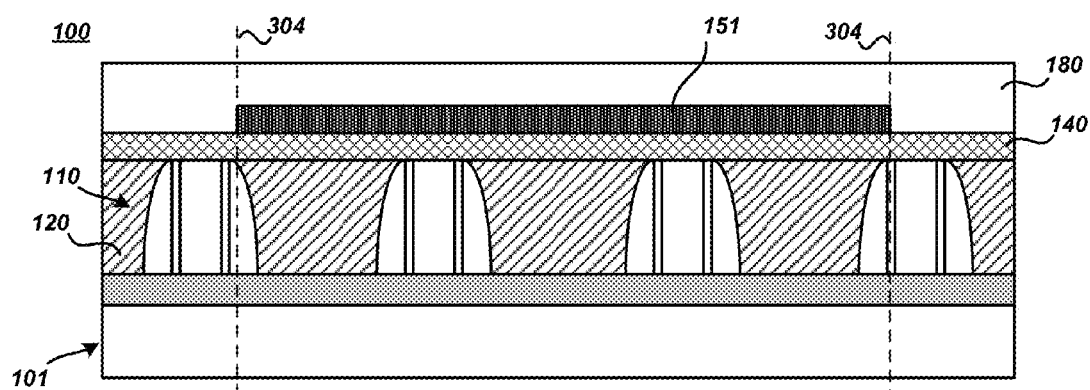
FIG. 11-FIG. 14 depict cross section views of semiconductor structures at intermediate stages of semiconductor device fabrication, in accordance with various embodiments of the present invention.

Referring now to FIG. 11, a cross section view of the structure 100 is shown at an intermediate step during a semiconductor device fabrication process flow. At this step of fabrication, the structure 100 may generally include an multi-layer isolator including the an alternative width barrier layer 151. In certain embodiments, the width of barrier layer 151 is determined by the underlying gate stacks 110. For example it may be advantageous for the barrier layer 151 to extend to a plane 304 that may bisect an inner location of a gate stack 110. In certain embodiments, the barrier layer 151 is formed over one or more inner gates stacks 110, with plane 304 being associated with outer gate stacks 110 as shown in FIG. 11. Also at this step of fabrication, the structure 100 may generally include interlayer dielectric 180 that may be formed upon barrier layer 151 and the exposed portions of dielectric layer 140.

Figure 12:
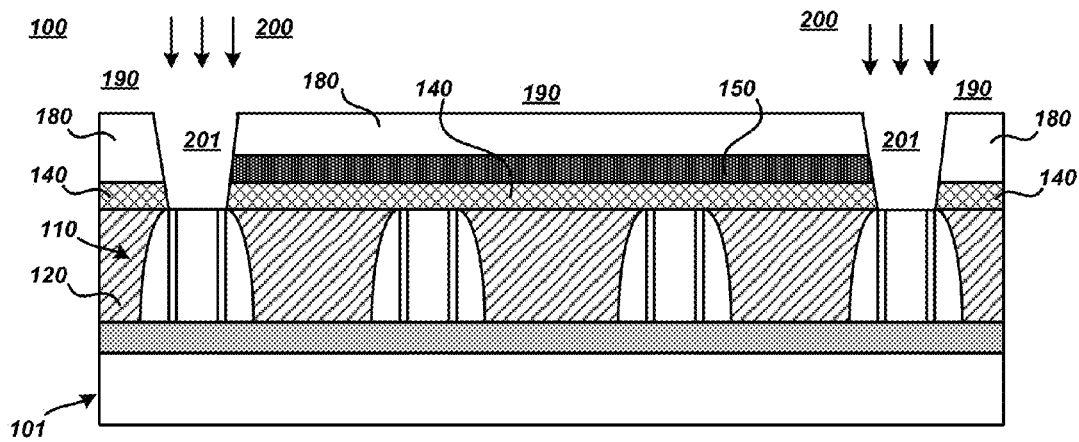

Referring now to FIG. 12, a cross section view of the structure 100 is shown at an intermediate step during a semiconductor device fabrication process flow. At this step of fabrication, the structure 100 may generally include a plurality of trenches 201. In an alternative embodiment, etch process 200 may remove the portions of interlayer dielectric 180, portions of barrier layer 151, and portions of dielectric layer 140 in the regions not covered by mask 190. The etch process 200 may be timed so these portions are removed selective to gate stacks 110 to form one or more trenches 201. Mask 190 may be removed from semiconductor structure 100 by known techniques.

Figure 13:
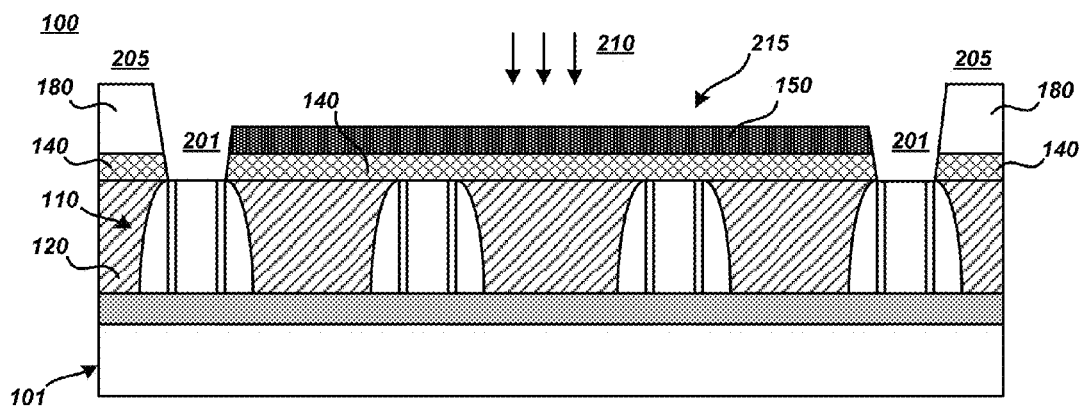

Referring now to FIG. 13, a cross section view of the structure 100 is shown at an intermediate step during a semiconductor device fabrication process flow. At this step of fabrication, the structure 100 may generally undergo an etch process 210 to remove the portions of interlayer dielectric 180 in the regions not covered by mask 205. The etch process 210 may be timed so these portions are removed selective to barrier layer 151.

Figure 14:
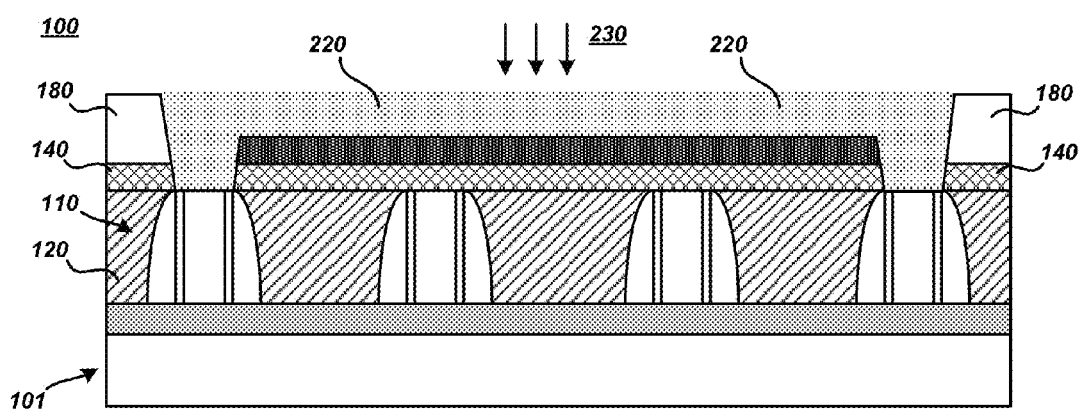

Referring now to FIG. 14, a cross section view of the structure 100 is shown at an intermediate step during a semiconductor device fabrication process flow. At this step of fabrication, the structure 100 may generally include contact bar 220. In an alternative embodiment, contact bar 220 serves to electrically connect gate stacks 110. For example, contact bar 220 may contact and electrically connect outer gate stacks 110 that are locationally separated by one or more inner gate stacks 110.

Figure 15:
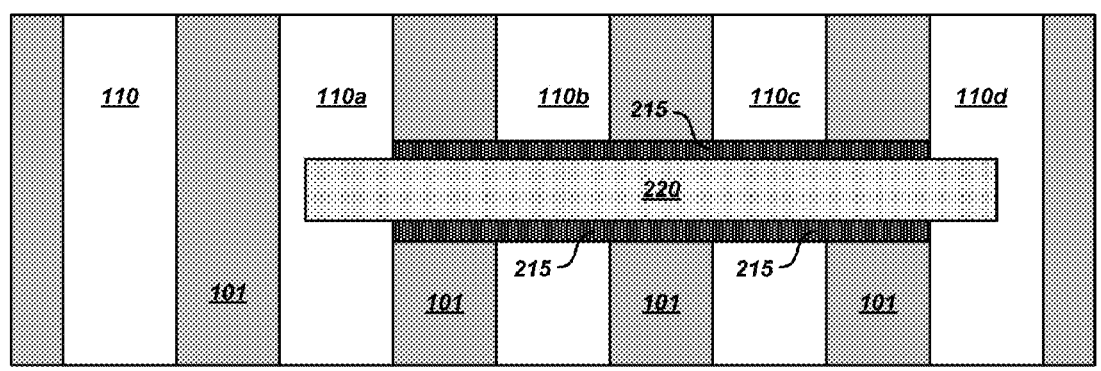
FIG. 15 depicts a top view of a semiconductor structure at an intermediate stage of semiconductor device fabrication, in accordance with various embodiments of the present invention.

Referring now to FIG. 15 that depicts a top view of an exemplary semiconductor structure 100 at intermediate stages of semiconductor device fabrication, in accordance with various embodiments of the present invention. In certain embodiments, contact bar 220 contacts and electrically connect gate stack 110*a* and gate stack 110*d* that are locationally separated by gate stack 110*b* and gate stack 110*c*. In certain embodiments, isolator 215 electrically separates the contact bar 220 from gate stack 110*b* and gate stack 110*c*.

In certain embodiments, contact bar 220 takes the form of a source/drain (CA) to source/drain (CA) jumper over one or more active gates. The barrier layer portion 151 is formed over dielectric portion 141 that cover the one or more active gates. The barrier layer portion 151 protects the underlying dielectric portion 141 (e.g. from being etched, etc.) while the contact bar 220 is formed. The protected dielectric portion 141 insulates the one or more active gates, underneath thereof, from the contact bar 220 formed on top thereof. In certain embodiments, the barrier layer portion 151 is made out of a resistive material made in connection with formation of structure 100 resistors made of the same resistive material.

Figure 16:
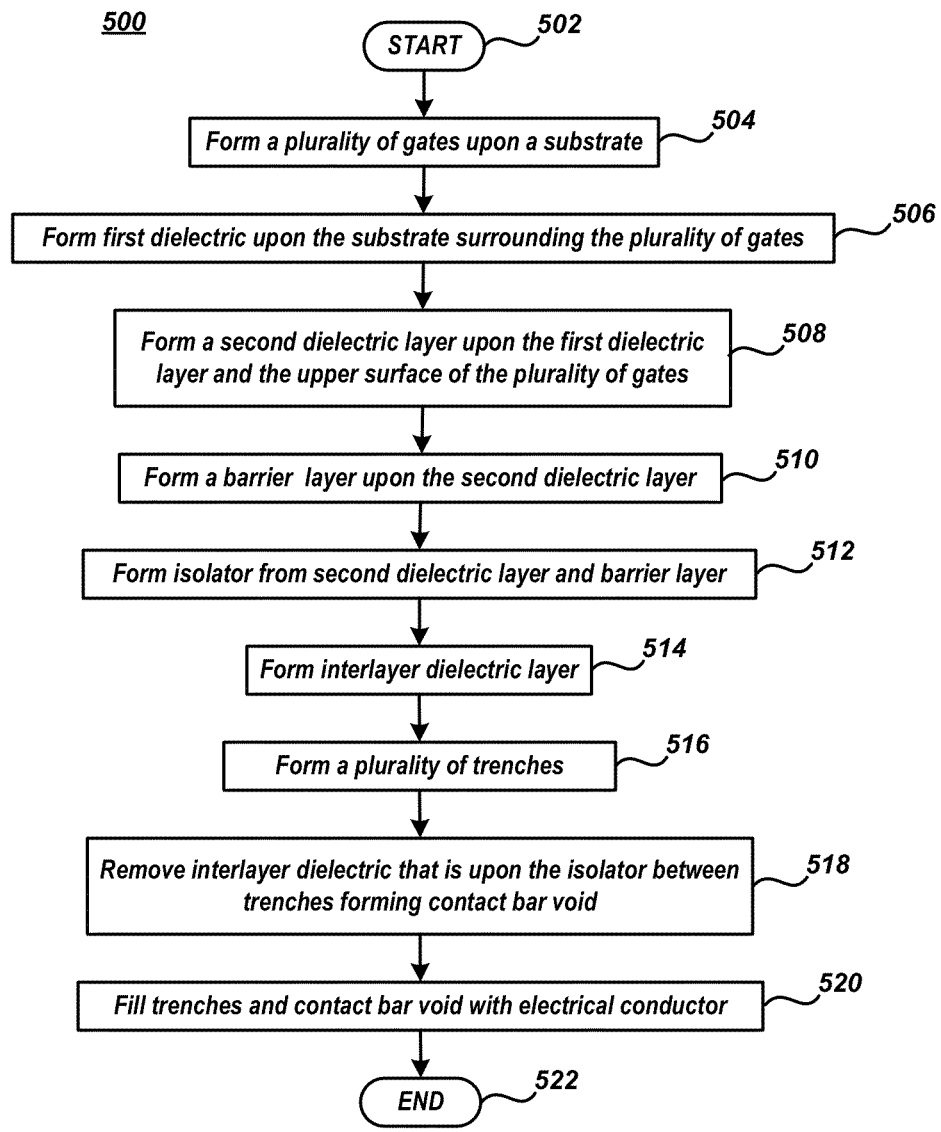
FIG. 16 depicts an exemplary semiconductor device fabrication process flow, in accordance with various embodiments of the present invention.

FIG. 16 depicts an exemplary semiconductor device fabrication process 500, in accordance with various embodiments of the present invention. Process 500 begins at block 502 and continues with forming a plurality of gate stacks 110, gates, etc. upon a semiconductor substrate 101 (e.g. SOI substrate, bulk substrate, etc.) (block 504). A first dielectric layer is formed upon the substrate surrounding the plurality of gates (block 506). For example, and oxide layer 120 is deposited upon substrate 101 surrounding plurality of gates stacks 110. A second dielectric layer is formed upon the first dielectric layer and upon the upper surface of the plurality of gates (block 508). For example, a dielectric layer 140 is formed upon oxide layer 120 and upon the upper surface of gate stack 110 subsequent to a MCP stage.

Process 500 continues by forming a barrier layer upon the second dielectric layer (block 510). For example, a barrier layer 150 is deposited upon dielectric layer 140. An isolator is formed from the second dielectric layer and/or barrier layer (block 512). For example, an isolator 215 is formed. In certain embodiments, the isolator 215 may be generally formed above at least one active area 250 and/or one inner gate stack 110 that locationally separate a plurality of active areas 240 and/or outer gate stacks 110.

Process 500 continues with forming an interlayer dielectric layer (block 514). For example, interlayer dielectric 180 is deposited upon the dielectric layer 140 and upon an barrier layer portion 151. Process 500 continues by forming a plurality of trenches (block 516). For example, one or more trenches 201 are formed selective to the substrate 101 and/or one or more trenches 201 are formed selective to a gate stack 110. The interlayer dielectric that was formed upon the isolator is removed between the trenches thereby forming a contact bar void (block 518). For example, the interlayer dielectric layer 180 portion above barrier layer portion 151 is removed. Process 500 continues by filling trenches and contact bar void with an electrical conductor (block 520). For example, W is deposited within trenches 201 and above the isolator 215. Process 500 ends at block 522.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The fabrication of the semiconductor structures herein have been described by a specific order of fabrication stages and steps. However, it is understood that the order may differ from that described. For example, the order of two or more fabrication steps may be switched relative to the order shown. Moreover, two or more fabrication stages or specific techniques may be conducted either concurrently or with partial concurrence. In addition, various fabrication steps may be omitted and other fabrication steps may be added. It is understood that all such variations are within the scope of the present invention.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device comprising:
a plurality of transistor gates comprising one or more inner gates and a plurality of outer gates, the plurality of transistor gates formed at least directly upon a buried-dielectric layer of a semiconductor substrate, the semiconductor substrate comprising a plurality of outer active areas and one or more inner active areas, wherein the plurality of outer active areas are of opposite polarity relative to at least one inner active area;
an isolator formed directly upon the one or more inner gates associated with the one or more inner active areas, the isolator comprising a protective barrier portion formed directly upon a dielectric layer formed at least directly upon the one or more inner gates; and
a monolithic contact bar electrically connecting the plurality of outer active areas, the monolithic contact bar formed directly upon the protective barrier portion, wherein the isolator electrically insulates the monolithic contact bar from the one or more inner gates.

2. The semiconductor device of claim 1, wherein the isolator also insulates the monolithic contact bar from the one or more inner active areas.

3. The semiconductor device of claim 1, wherein the isolator is formed inline with the plurality of outer active areas.

4. The semiconductor device of claim 1, further comprising an interlayer dielectric, wherein a top surface of the monolithic contact bar and a top surface of the interlayer dielectric are coplanar.

5. The semiconductor device of claim 1, wherein the semiconductor substrate is a silicon on insulator (SOI) substrate.

6. The semiconductor device of claim 1, wherein the semiconductor substrate is a bulk substrate.

7. The semiconductor device of claim 1, wherein the plurality of outer active areas and the one or more inner active areas are source/drain regions.

8. A semiconductor device comprising:
a plurality of transistor gates comprising one or more inner gates and a plurality of outer gates, the plurality of transistor gates formed at least directly upon a buried-dielectric layer of a semiconductor substrate;
an isolator formed directly upon the one or more inner gates, the isolator comprising a protective barrier portion formed directly upon a dielectric layer formed at least directly upon the one or more inner gates; and
a monolithic contact bar electrically connecting the plurality of outer gates, the monolithic contact bar formed directly upon the protective barrier portion, wherein the isolator electrically insulates the monolithic contact bar from the one or more inner gates.

9. The semiconductor device of claim 8, wherein the isolator also insulates the contact bar from one or more source/drain regions associated with the one or more inner gates.

10. The semiconductor device of claim 8, wherein the isolator is formed inline with the plurality of outer gates.

11. The semiconductor device of claim 8, further comprising an interlayer dielectric, wherein a top surface of the monolithic contact bar and a top surface of the interlayer dielectric are coplanar.

12. The semiconductor device of claim 8, wherein the semiconductor substrate is a silicon on insulator (SOI) substrate.

13. The semiconductor device of claim 8, wherein the semiconductor substrate is a bulk substrate.

14. A semiconductor device fabrication method comprising:
   forming a plurality of transistor gates comprising one or more inner gates and a plurality of outer gates at least directly upon a buried-dielectric layer of a semiconductor substrate, the semiconductor substrate comprising a plurality of outer active areas and one or more inner active areas, wherein the plurality of outer active areas are of opposite polarity relative to at least one inner active area;
   forming an isolator directly upon the one or more inner gates, the isolator comprising a protective barrier portion formed directly upon a dielectric layer formed at least directly upon the one or more inner gates; and
   forming a monolithic contact bar electrically connecting the plurality of outer active areas directly upon the protective barrier portion, wherein the isolator electrically insulates the monolithic contact bar from the one or more inner gates.

15. The method of claim 14, wherein the isolator is formed inline with the plurality of outer active areas.

* * * * *